United States Patent

Moo

[19]

[11] Patent Number: 6,141,640
[45] Date of Patent: Oct. 31, 2000

[54] MULTISTAGE POSITIVE PRODUCT VECTOR QUANTIZATION FOR LINE SPECTRAL FREQUENCIES IN LOW RATE SPEECH CODING

[75] Inventor: Peter Warren Moo, Ann Arbor, Mich.

[73] Assignee: General Electric Company, Schenectady, N.Y.

[21] Appl. No.: 09/027,495

[22] Filed: Feb. 20, 1998

[51] Int. Cl.[7] .................................................. H03M 7/30
[52] U.S. Cl. ........................ 704/222; 348/422; 382/253
[58] Field of Search .................................. 704/500, 501, 704/219, 222; 348/414, 417, 418, 422; 382/253; 341/200

[56] References Cited

U.S. PATENT DOCUMENTS

| | | | |
|---|---|---|---|
| 5,124,701 | 6/1992 | Charbonnier et al. | 341/61 |
| 5,204,899 | 4/1993 | Israelsen et al. | 380/14 |
| 5,832,443 | 11/1998 | Kolesnik et al. | 704/500 |

FOREIGN PATENT DOCUMENTS

| | | | |
|---|---|---|---|
| 284 962 B1 | 3/1994 | European Pat. Off. | 704/222 |
| 284962B1 | 3/1994 | Germany . | |

OTHER PUBLICATIONS

Gersho et al, "Vector quantization and signal compression" Kluwer Academic publishers, p. 451, 1992.

"An Algorithm for Vector Quantizer Design", Yoseph Linde, Andres Buzo and Robert M. Gray, IEEE Transactions on Communications, vol. Com–28, No. 1, Jan. 1980, pp. 84–95.

"Two–Stage Vector Quantization–Lattice Vector Quantization", Jianping Pan and Thomas R. Fischer, IEEE Transactions on Information Theory, vol. 41, No. 1, Jan. 1995, pp. 155–163.

"Asymptotic Distribution of the Errors in Scalar and Vector Quantizers", Don H. Lee and David L. Neuhoff, IEEE Transactions on Information Theory, vol. 42, No. 2, Mar. 1996, pp. 446–460.

"Cell–Conditioned Multistage Vector Quantization", D.H. Lee, D.L. Neuhoff, K.K. Paliwal, IEEE—1991—pp. 653–656.

"Line Spectrum Pair (LSP) and Speech Data Compression", Frank K. Soong, Biing–Hwang Juang, IEEE—1984—pp. 1.10.1–1.10.4.

"Efficient Vector Quantization of LPC Parameters at 24 Bits/Frame", Kuldip K. Paliwal, Bishnu S. Atal, IEEE Transactions on Speech and Audio Processing, vol. 1, No. 1, Jan. 1993, pp. 3–14.

Primary Examiner—Richemond Dorvil
Assistant Examiner—Harold Zintel
Attorney, Agent, or Firm—Jean K. Testa; Donald S. Ingraham

[57] ABSTRACT

A digital transmitter/receiver communications system transmits audio voice signals over a channel with increased quality for a specified bit rate. The method of encoding takes advantage of spherical symmetry of error vectors associated with encoding Line Spectral Frequency (LSF) coefficients, to reduce the information transmitted. Errors in encoding the LSF coefficient sets, vectors J, are modeled by a number of vectors $J_p$ having all positive components, and a sign vector s indicating the polarity of each component of the vector. Each LSF vector J intended to be transmitted is approximated by a positive vector $J_p$ and a sign vector s. An index $I_p$ of the positive vector $J_p$ and the sign vector corresponding to vector J are transmitted, along with other audio information to a receiver/decoder where the signal is decoded into an audio signal closely representing the original signal intended to be transmitted.

4 Claims, 3 Drawing Sheets

MULTISTAGE POSITIVE PRODUCT VECTOR QUANTIZATION FOR LINE SPECTRAL FREQUENCIES IN LOW RATE SPEECH CODING

BACKGROUND OF THE INVENTION

1. Field of the Invention

This invention relates to digital communication, and more specifically to digital voice communication.

2. Discussion of Related Art

High quality reproduction of speech signals at low bit rates is extremely important for a system with valuable fixed resources, such as a fixed bandwidth. Improvements in voice coding, vocoding, that reduce bit rate while maintaining speech quality can dramatically increase the total number of users on a fixed bandwidth, and therefore increase revenue.

Linear predictive coding (LPC) has been shown to provide acceptable performance at rates below 2.4 kbps. In LPC, short-term changes in a voice patterns are reflected as changes in spectral envelope. The spectral envelope may be quantized using stored tables into Line Spectral Frequencies (LSF's) which are transmitted to a receiver for decoding. Efficient quantization of the spectral envelope, and therefore of the LSF's, are vital to producing high quality speech.

The LSFs are decoded at a receiver making use of stored tables which are the inverse of those used at the transmitter for quantization. Larger tables provide higher quality, but require a larger memory.

Currently there is a need for a lower rate digital voice communication technique exhibiting the same, or increased voice quality, with lower complexity and lower storage requirements.

SUMMARY OF THE INVENTION

In order to efficiently quantize the LSF's in LPC-based coders, the present invention employs Multistage Positive Product Vector Quantization (MSPPVQ), a multistage VQ technique for LSF quantization.

A transmitter/encoder encodes a plurality of input vectors J, representing a signal intended to be transmitted, such as an audio signal, in a compressed fashion taking advantage of the radial symmetry of the input vector set.

A sign vector device receives the input vector J and creates a unit vector s having the same dimensions as vector J with same signs for each component as J;

A sign rectification device receives input vector J and switches the polarity of all negative components of input vector J to create a vector $J_p$ having all positive components.

A base index lookup device, employs a base codebook comprised of a plurality of prestored base vectors $\hat{J}_p$ with associated indices $I_p$, each vector having all positive components. Base index lookup device operates to find the closest vector $\hat{J}_p$ to J in base codebook, and its index $I_p$.

A transmitter, coupled to the base index lookup device, the sign vector device transmits the index $I_p$ of closest vector $\hat{J}_p$, and the sign vector s to a receiver/decoder for decoding.

The system also may include a receiver/decoder for receiving a low bit rate signal having a plurality of sets of indices $I_p$, sign vectors s, and decodes them into an approximation of the original input vectors J.

A receiver front end in the decoder/receiver receives $I_p'$ and s', from the transmitter being the information transmitted denoted with the same unprimed letters, with some noise due to transmission;

A base vector lookup device connected to the front end operates to look up index $I_p'$ in a prestored base codebook similar to that used by the transmitter in creating indices $I_p$, to find corresponding base vector $\hat{J}_p'$; and A multiplier connected to the base vector lookup device and front end, acts to adjust the sign of the base vector $\hat{J}_p'$ according to sign vector s' to result in a vector $\hat{J}'$ being an approximation of vector J.

OBJECTS OF THE INVENTION

An object of the present invention is to provide a digital voice transceiver which operates at a lower bit rate to result in at least the same speech quality as was previously possible.

Another object of the present invention is to provide a digital modulation scheme capable of sending more information on a fixed bandwidth since it operates at a lower bit rate than was previously possible.

Another object of the present invention is to provide a digital voice transceiver which requires a smaller memory than previously possible to result in the a specified speech quality.

Another object of the present invention is to make use of the spherically symmetric properties of a signaling constellation to reduce the size of a stored codebook.

Another object of the present invention is to provide a digital transceiver which produces increased voice quality for a given memory size.

DETAILED DESCRIPTION OF INVENTION

Figure 1:
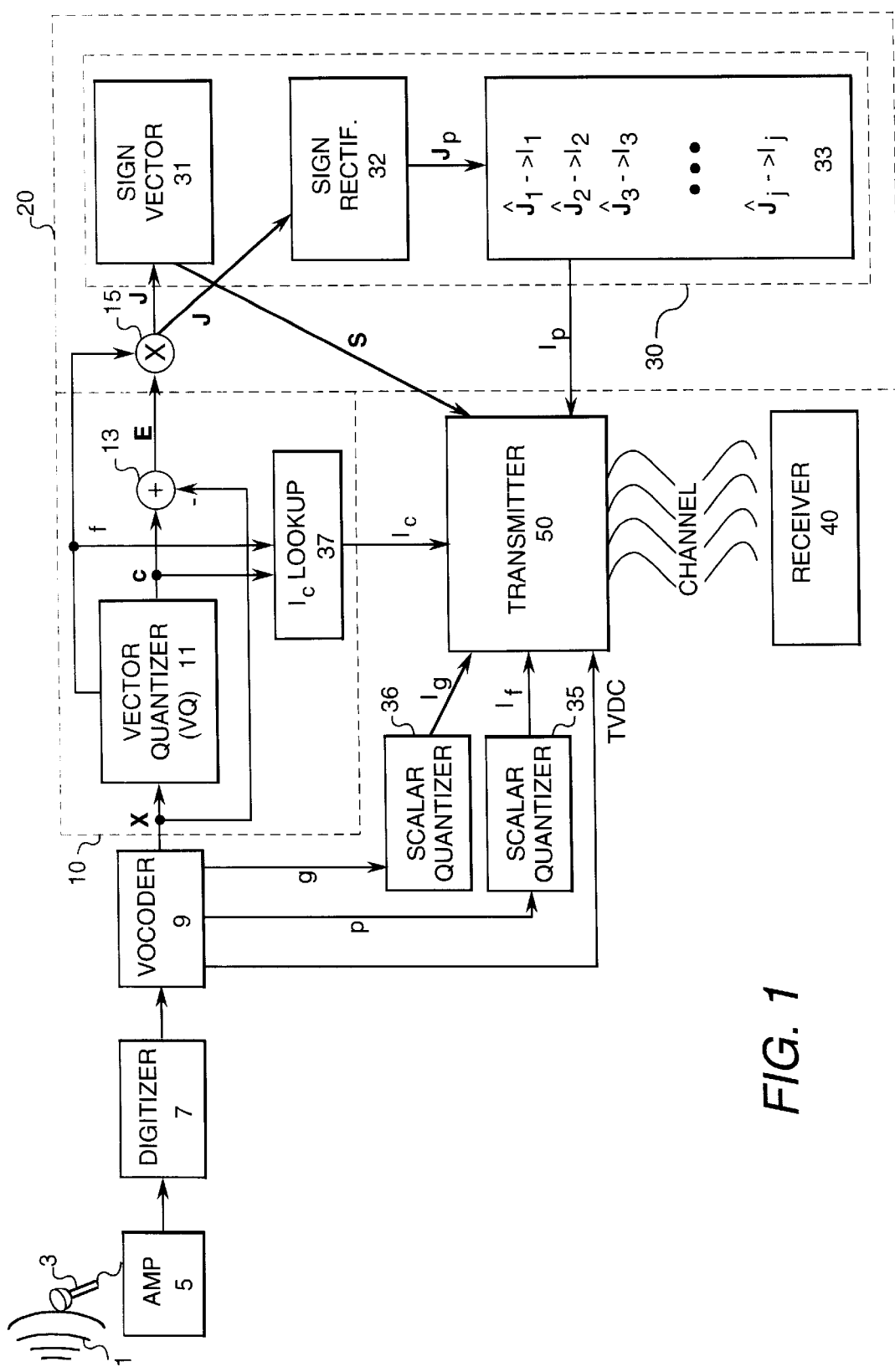
FIG. 1 is a simplified block diagram of one embodiment of the Multistage Positive Product Vector Quantization system according to the present invention.

A transmitter/encoder employing MSPPVQ according to the present invention is illustrated in FIG. 1. For purposes of clarity, discussion is limited to case of a first and a second stage 10, 20, respectively, although our the present invention may be generalized to more than two stages.

An audio input signal, being either voice or sounds, is provided to a transducer 3, such as a microphone, which produces a electronic signal. This electronic signal is amplified by an amplifier 5, then digitized by a digitizer 7 to produce digital samples V of the amplified signal.

The sampled signal V is passed to a voice coder 9, which may be a conventional voice coder, that creates a gain g, pitch p, a TVDC indicating if the signal is voiced or unvoiced, such as fricative sounds, and a set of line spectrum frequency (LSF) coefficients, referred to as a source vector X, for each frame of speech. Pitch p and gain g and are passed forward to be quantized in scalar quantizers 35, 36, respectively to produce indices $I_p$, $I_g$, respectively, which are passed to a transmitter 50 for later transmission to a remote receiver/decoder 40. The set of line spectrum frequency (LSF) coefficients are further processed to reduce the number of bits required to reproduce an audio signal similar to the original audio input signal 1.

A typical frame may be 20 milliseconds long having 10 LSF Coefficients in a set. These numbers may vary but are provided here to give a feel of typical values.

Each source vector X is quantized in first stage 10 in a vector quantizer (VQ) 11 employing a stored codebook, which produces a codevector C having the same dimensionality as source vector X, for each source vector X. VQ device 11 also uniquely determines a (scalar valued) scaling factor f that is passed forward to second stage 20 of the present invention.

In general, a conventional VQ can be used as device 11, but preferably an optimal quantizer is used. An optimal VQ uses an optimal codebook and encodes a source vector to the nearest codevector using a full search technique. An optimal codebook is a codebook that has been designed with the generalized Lloyd algorithm (GLA) . The reference for the generalized Lloyd algorithm is: Y. Linde, A. Buzo, and R. M. Gray, "An Algorithm for Vector Quantizer Design", IEEE Trans. Commun., Vol. COM-28, No. 1, pp. 84–95, January 1980.

An $I_c$ lookup device 37 is coupled to vector quantizer 11 which operates to look up an index $I_c$ of a stored codevector Ĉ which most closely matches C. It provides index $I_c$ to a transmitter device 50.

Each source vector X is then subtracted from its codevector C in a subtraction device 13 to produce the error vector E, again having the same dimensionality as source vector X. Elements up to this point are part of first stage 10 of the invention.

Error vector E is then provided to a second stage 20 of the present invention. Error vector E is multiplied by scaling factor f of VQ device 11 in a multiplication device 15 to produce a scaled error vector J. J is then quantized in a Positive Product Vector Quantizer (PPVQ).

PPVQ device 30 employs a low-complexity, low-storage product quantization technique that works well for sources with an approximately spherically symmetric distribution. PPVQ device 30 has a sign vector device 31 which receives scaled error vector J and creates a unit sign vector s having the same sign for each dimension as the scaled error vector J. This sign vector s is passed to transmitter device 50 for later transmission across a channel.

A sign rectification device 32 also receives scaled error vector J and converts the sign of all negative components of J to produce an all-positive vector $J_p$.

A base index lookup device 33 has a prestored table of positive constellation vectors $\hat{J}_p$ which comprise a base codebook. Base index lookup device 33 receives vector $J_p$ finds a closest entry $\hat{J}_p$ in the base codebook. It then passes an index $I_p$ of codebook entry $\hat{J}_p$ to transmitter device 50.

Base index lookup device 33 employs a base codebook of size N, which is comprised of k-dimensional vectors $\hat{J}_p$ in the region $\{x:x_i \geq 0, \forall i\}$, that is, all base codevectors $\hat{J}_p$ have positive elements. Vectors with all positive components will be referred to as 'positive vectors'.

Each base codevector represents $2^k$ effective codevectors as follows. Sign vector s is defined as a k-dimensional vector with entries +1 or −1. Let S consist of the $2^k$ unique sign vectors in k dimensions. For each base codevector y, the corresponding set of $2^k$ effective codevectors may be generated by the component-wise multiplication of y by each element of S. In this way, a b-bit PPVQ base codebook generates a (k+b)-bit effective codebook.

Gain index $I_g$, pitch index $I_f$, sign vector s, positive vector index $I_p$, code index $I_c$ are passed to a transmitter 50 which transmits the information across a channel to receiver 40.

Figure 2:
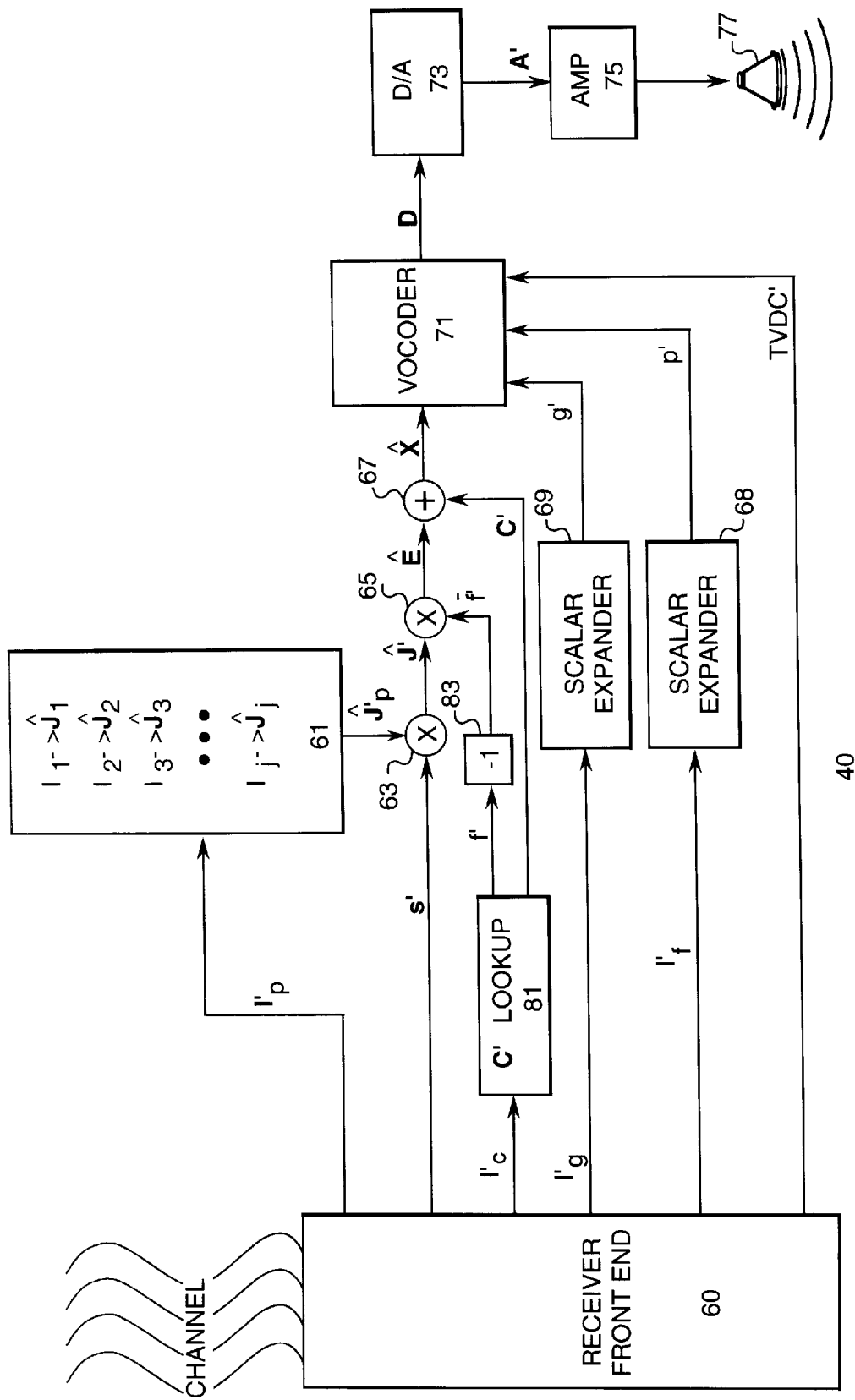
FIG. 2 illustrates a more detailed block diagram of the receiver in one embodiment of the Multistage Positive Product Vector Quantization system according to the present invention.

Referring to FIG. 2, showing a more detailed block diagram of receiver 40, a front end device 60 of receiver 40 samples, receives, digitizes the signal and separates it into positive vector index I'$_p$, sign vector s', codevector index I'$_c$, gain index I'$_g$, pitch index I'$_f$ and TVDC'. Each of the components with a prime "'" after them correspond to the unprimed component transmitted from transmitter 50 with the inherent errors caused by transmission through the channel. The channel may be radio transmission through the air, hardwired transmission, fiber optic transmission, and equivalent conventional transmission means.

Index I'$_p$ is passed to a base vector lookup device 61 which looks up a positive vector J'$_p$ corresponding to index I'$_p$, being just the inverse of that done in the encoder.

The sign vector s' corresponding to the index I'$_p$ is multiplied by J'$_p$ in a multiplication device 63 to result in Ĵ'.

An C' lookup device 81 is coupled to receiver front end 60 which operates in a complementary fashion as $I_c$ lookup device 37 in the coder/transmitter. It receives codevector index I'$_c$, and creates a corresponding codevector C', and an associated scaling factor f'.

An inversion device 83 inverts scaling factor to create and inverse scaling factor f̂'.

PPVQ codevector Ĵ is then multiplied by the inverse scaling factor f' in a multiplication device 65 to generate a codevector Ê.

Each first and second stage codevector, C and Ê, respectively, are added in an adder 67 to result in a codevector X̂.

Scalar expanders 68, 69 performs a complementary function as that of scalar quantizers 35, 36 to recover the pitch p and gain g from $I_f$, $I_g$, respectively.

Codevector X̂ is passed to a vocoder 71 in receiver 40 along with gain g', pitch p' and TDVC' to create a digital signal D. Signal D is a digital representation of the original signal 1 intended to be transmitted. This may be employed by a digital playback unit 70 to produce a signal similar to the original audio signal 1.

Digital playback unit 70 may include a D/A converter 73 to produce an analog signal A which is amplified by an amplifier 75. The amplified analog signal is provided to an audio output device 77, such as a speaker.

This structure is similar to that described in "Two Stage Vector Quantization-Lattice Quantization", IEEE Trans. Inform. Theory", Vol. 41, No. 1, pp. 155–163, January 1995, which employs second-stage lattice quantization. The second stage quantizer of the present invention, however, employs PPVQ.

Figure 4:
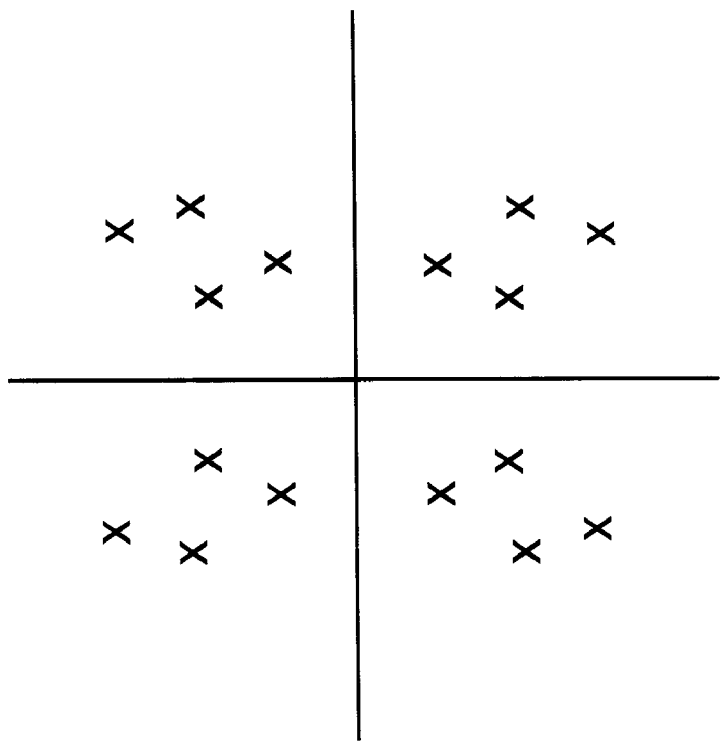
FIG. 4 illustrates an effective codebook generated from the base codebook of FIG. 3 and sign vectors s in two dimensions according to the present invention.
Figure 3:
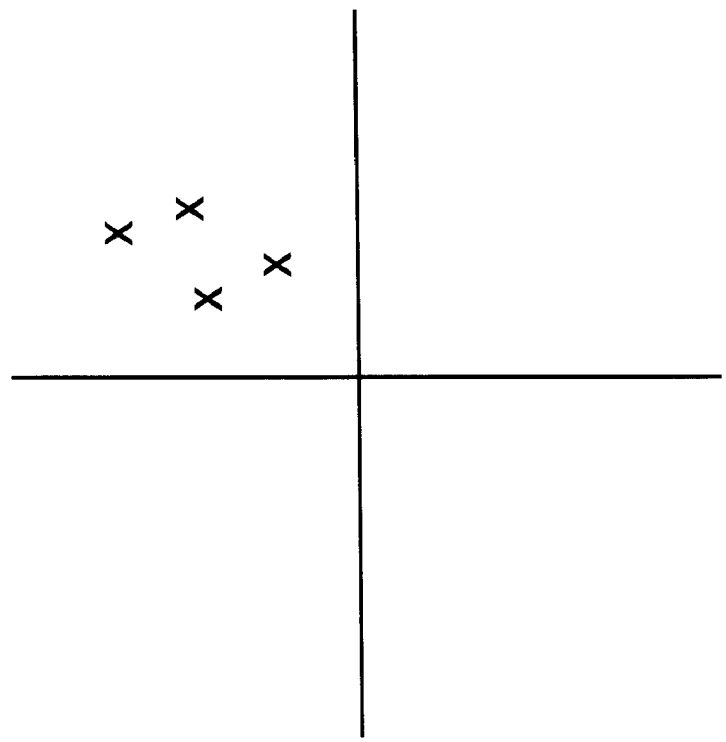
FIG. 3 illustrates a positive vectors $J_p$ base vectors of a simple base codebook in two dimensions which may be used in Positive Product Vector Quantization according to the present invention.

FIGS. 3 and 4 illustrate the operation of PPVQ device 30 in a simple two-dimensional example, according to the present invention. A base codebook consists of four positive vectors, each indicated in FIGS. 3 and 4 with an 'x'. In two dimensions, there are four possible sign vectors, (+1,+1), (+1,−1), (−1,+1), and (−1,−1), as illustrated in FIG. 3. Each sign vector s is multiplied component-wise by each base codevector y to generate the effective codebook shown in FIG. 4.

In general, PPVQ device 30 can operate with any number of dimensions k. PPVQ encoder 30 operates on a k-dimensional vector J by determining the signs of each component of J and generating a k-dimensional sign vector s, being k bits long, one bit defining if the dimension is positive or negative. The encoder then forms the positive vector for J, denoted $J_p$ by taking the absolute value of each of the components of J. The vector $J_p$ is then encoded to the nearest codevector Ĵ in the base codebook. Codevector Ĵ is identified by its index $I_p$. If the base codebook has j entries, $j=2^b$, then index $I_p$ is b bits long. PPVQ encoder 30 transmits the sign vector s and the index $I_p$, a total of k+b bits, to the decoder.

Although the effective codebook uses k+b bits, note that PPVQ of the present invention has the complexity of a vector quantizer with a size N codebook. At the encoder, the positive codevector $Y_p$ is encoded to one of $2^b$ base codevectors, and only these $2^b$ codevectors are stored at the encoder and decoder. Therefore, PPVQ greatly reduces complexity for higher dimensions. The effective codebook created from a base codebook and the sign vectors according to the present invention, is spherically symmetric. Therefore, the present invention quantizes sources that have a spherically symmetric distribution more efficiently that those with less spherical symmetry.

For sources that are not spherically symmetric, PPVQ may incur slightly higher distortion than optimal VQ at the same bit rate. However, under fixed complexity constraints, the complexity-reducing structure of the present invention may allow for the use of a larger effective codebook than is possible with optimal VQ. This increase in effective codebook size may then compensate for any performance loss due to the structure of PPVQ.

PPVQ works well as a second stage quantizer in a multistage framework, because the first-stage errors have low correlation. It has been shown that asymptotically (for high rate), the probability density function of the quantization error of optimal VQ is spherically symmetric as described in D. H. Lee and D. L. Neuhoff, "Asymptotic Distribution Of The Errors In Scalar And Vector Quantizers" *IEEE Trans. Inform. Theory*, vol. 42, pp. 446–460, March 1996. We have observed that first-stage quantization error has low correlation, even at low rates. Therefore, if an optimal VQ is used for the first stage, the first-stage errors have a distribution that is approximately spherically symmetric, and PPVQ yields good performance.

Specifically, MSPPVQ can be used to quantize LSF's in low-rate vocoders. We have shown that vocoders that use MSPPVQ achieve the same distortion at a reduced bit rate, compared to vocoder that use the de facto standard Split VQ. This allows an increased number of users in a fixed bandwidth system (for example, satellite-based telephony) and can dramatically increase total revenue and profit.

Performance

In tests, the present invention performed well. At 30 and 26 bits per frame, MSPPVQ achieves lower spectral distortion than Split VQ, with a modest increase in distortion. At 22 bits per frame, MSPPVQ has approximately the same spectral distortion as Split VQ and has much less complexity. In informal listening tests, MSPPVQ produced fuller-sounding speech compared to Split VQ.

What is claimed is:

1. A low bit rate method of communicating an input vector X representing an audible signal through a channel comprising the steps of:
    a) quantizing the input vector X to determine a scalar scaling factor f and a codevector C;
    b) looking up codevector C and scaling factor f in a codebook to create an index $I_c$;
    c) subtracting the codevector C from the original input vector X to result in an error vector E;
    d) scaling the error vector E by scaling factor f to result in scaled error vector J;
    e) selecting a plurality of base vectors $Ĵ_p$ having all positive components to comprise a base codebook;
    f) creating a unit sign vector s having the same dimensions as vector J with same signs for each component as J;
    g) switching the polarity of all negative components of input vector J to create $J_p$;
    h) finding an index, $I_p$, of the vector in the base codebook closest to $J_p$;
    i) transmitting the index $I_p$, sign vector s, and index $I_c$ to a receiver/decoder.

2. The low bit rate method of communicating of claim 1 further comprising, after the step of transmitting, at a receiver/decoder the steps of:
    a) receiving a dataset $I_p'$, s', and $I_c'$ at the receiver/decoder being the information transmitted denoting the data set $I_p$, s, and $I_c$, respectively, with added noise due to transmission;
    b) converting $I_c'$ to a codevector C' and a scaling factor f;
    c) looking up index $I_p'$ in a base codebook having the same vectors as that of the transmitter/encoder, to result in corresponding base vector $Ĵ'_p$;
    d) adjusting the sign of the base vector $Ĵ'_p$ by sign vector s' to result in a vector Ĵ' being an approximation of vector J;
    e) inverting scaling factor f' into inverse scaling factor $\bar{f}'$;
    f) multiplying vector Ĵ' by received inverse scaling factor $\bar{f}'$ to result in vector Ê;
    g) adding vector Ê and codevector C' to result in the decoded vector X̂ being substantially similar to an input vector X representing an audible signal provided to a transmitter, and
    h) repeating steps (a)–(e) for a plurality of datasets resulting in a plurality of decoded vectors X.

3. A method of decoding a low bit rate signal having a plurality of transmitted datasets of indices $I_p'$, sign vectors s', and codevector indices $I_c'$, into an audio signal comprising the steps of:
    a) receiving said transmitted dataset, $I_p'$ and s', and $I_c'$, at a decoder/receiver;
    b) converting codevector index $I_c'$ into a codevector C' and a scaling factor f';
    c) looking up index $I_p'$ in a base codebook with substantially the same base vectors as that used by a transmitter/encoder, to result in one of the corresponding base vector $Ĵ'_p$;
    d) adjusting the sign of the base vector $Ĵ'_p$ by sign vector s' to result in a vector Ĵ';
    e) inverting scaling factor f' into inverse scaling factor $\bar{f}'$;
    f) multiplying vector Ĵ' by inverse scaling factor $\bar{f}'$ to arrive at vector Ê;
    g) adding vector Ê and codevector C' to result in the decoded vector X̂ representing a portion of an audio signal.

4. A low bit-rate system for communicating an input vector X representing an audible signal comprising:
    a) a vector quantization (VQ) device which receives the input vector X and determines a scalar scaling factor f and a codevector C;
    b) an addition device coupled to the VQ device which subtracts the quantized codevector C from the original input vector X to result in an error vector E;

c) an $I_c$ lookup device having a codebook comprised of a plurality of prestored base vectors $\hat{C}$ with associated indices, operating to find the closest vector C in base codebook, and its index $I_c$;

d) a multiplication device coupled to addition device and VQ device which scales the error vector E by scaling factor f to result in scaled error vector J;

e) a sign vector device coupled to multiplier for receiving vector J and creating a unit vector s having the same dimensions as vector J with same signs for each component as J;

f) a sign rectification device coupled to multiplier device for switching the polarity of all negative components of input vector J to create vector $J_p$;

g) a base index lookup device having a base codebook comprised of a plurality of prestored base vectors $\hat{J}_p$ with associated indices, each vector having all positive components, operating to find the closest vector $\hat{J}_p$ to $J_p$ in base codebook, and its index $I_p$;

h) a transmitter coupled to the $I_c$ lookup device, sign vector device, and base index lookup lookup device for transmitting a plurality of datasets each comprising the look up index $I_p$, sign vector s, and index $I_c$ to a receiver/decoder;

i) a receiver front end in a decoder/receiver for receiving $I_p{}'$ and s', and codevector index $I_c$ from the transmitter being the dataset transmitted denoting the data sets $I_p$, s, and $I_c$, respectively, with added noise due to transmission;

j) a C' lookup device coupled to receiver front end for converting codevector index $I_c{}'$ into codevector C' and scaling factor $\bar{f}$;

k) an inverter coupled to the receiver front end that inverts the scaling factor f' into inverse scaling factor $\bar{f}$;

l) a base vector device coupled to the front end operating to look up index $I_p{}'$ in a prestored base codebook substantially similar to that of base index lookup device in the transmitter to find corresponding base vector $\hat{J}'_p$;

m) a multiplier coupled to base vector lookup device and front end acting to adjust the sign of the base vector $\hat{J}'_p$ according to sign vector s' to result in a vector $\hat{J}'$ being an approximation of vector J;

n) a scaling device coupled to multiplier and inverter operating to scale vector $\hat{J}'$ by inverse scaling factor $\bar{f}$ to arrive at vector $\hat{E}$; and o) an adder coupled to front end and scaling device for combining vector $\hat{E}$ and received codevector C' into a decoded vector being substantially similar to the input vector X.

* * * * *